(12) United States Patent
Sonwane et al.

(10) Patent No.: US 12,187,123 B2
(45) Date of Patent: Jan. 7, 2025

(54) CONTROL PANEL INTENDED TO BE ARRANGED INSIDE THE PASSENGER COMPARTMENT OF A VEHICLE AND CONTROL ASSEMBLY COMPRISING THE CONTROL PANEL

(71) Applicant: FAURECIA INTERIEUR INDUSTRIE, Nanterre (FR)

(72) Inventors: Rajesh Sonwane, Satara Parisar—Aurangabad Maha (IN); Ahamed El Sayed, Chanteloup les Vignes (FR); Jérôme Ple, Cergy (FR)

(73) Assignee: FAURECIA INTERIEUR INDUSTRIE, Nanterre (FR)

( * ) Notice: Subject to any disclaimer, the term of this patent is extended or adjusted under 35 U.S.C. 154(b) by 301 days.

(21) Appl. No.: 17/720,121

(22) Filed: Apr. 13, 2022

(65) Prior Publication Data
US 2022/0324330 A1     Oct. 13, 2022

(30) Foreign Application Priority Data
Apr. 13, 2021   (FR) ........................... 2103814

(51) Int. Cl.
| | | |
|---|---|---|
| *B60K 35/10* | (2024.01) | |
| *G01B 7/16* | (2006.01) | |
| *H01H 13/14* | (2006.01) | |

(52) U.S. Cl.
CPC ............... *B60K 35/10* (2024.01); *G01B 7/18* (2013.01); *H01H 13/14* (2013.01); *B60K 2360/42* (2024.01); *B60K 2360/48* (2024.01)

(58) Field of Classification Search
CPC ........ H01H 13/00; H01H 13/04; H01H 13/06; H01H 13/14; H01H 13/64; H01H 13/70; H01H 13/702; H01H 13/703; H01H 13/704; H01H 13/705; H01H 2003/00; H01H 2003/007; H01H 2003/12; H01H 2009/02; H01H 2221/00; H01H 2221/002; H01H 2221/09; H01H 2223/034; H01H 2223/0345; H01H 2231/026; H01H 2239/01; H01H 3/12; H01H 9/00;
(Continued)

(56) References Cited

U.S. PATENT DOCUMENTS

| | | |
|---|---|---|
| 2007/0151835 A1 | 7/2007 | Rakers et al. |
| 2010/0141580 A1 | 6/2010 | Oh |
| 2016/0218712 A1 | 7/2016 | Ben Abdelaziz |

FOREIGN PATENT DOCUMENTS

| | | |
|---|---|---|
| CN | 109682506 A | 4/2019 |
| DE | 102015001118 A1 | 8/2016 |

(Continued)

OTHER PUBLICATIONS

French Search Report corresponding to French Application No. FR 2103814, dated Dec. 3, 2021, 8 pages.

*Primary Examiner* — Anthony R Jimenez
(74) *Attorney, Agent, or Firm* — Reising Ethington P.C.

(57) ABSTRACT

A control panel having: a trim element having a first outer face and a first inner face; a support element having a second outer face oriented towards the first inner face of the trim element and a second inner face opposite to said second outer face; and a group of force sensors configured for detecting a control force applied to the first outer face within a control area. The support element has, within a detection area extending around the group of control areas, a mechanical weakening formed by a recess in the second inner face.

12 Claims, 2 Drawing Sheets

(58) Field of Classification Search
CPC ............. H01H 9/02; H01H 2003/0293; H01H
2231/016; H01H 2239/006; H01H
2239/074; B60K 2360/42; B60K 2360/78;
B60K 35/00; B60K 35/10; B60K
2360/1434; B60K 2360/339; B60K
2360/34; B60K 2360/345; H03K
2217/96062; H03K 17/975; G01B 7/16
USPC ...................................................... 200/512
See application file for complete search history.

(56) References Cited

FOREIGN PATENT DOCUMENTS

| | | | |
|---|---|---|---|
| DE | 102017214533 | B3 | 10/2018 |
| DE | 102018126472 | A1 | 4/2020 |
| EP | 3051698 | A1 | 8/2016 |
| FR | 2881091 | A1 | 7/2006 |
| FR | 3040337 | A1 | 3/2017 |
| WO | 2004069578 | A2 | 8/2004 |
| WO | 2018206119 | A1 | 11/2018 |

CONTROL PANEL INTENDED TO BE ARRANGED INSIDE THE PASSENGER COMPARTMENT OF A VEHICLE AND CONTROL ASSEMBLY COMPRISING THE CONTROL PANEL

TECHNICAL FIELD

This invention relates to a control panel intended to be arranged inside the passenger compartment of a vehicle, for example a motor vehicle, as well as to a control assembly comprising the control panel.

BACKGROUND

A control panel intended to be arranged inside a passenger compartment of a vehicle in order to control a device of the vehicle is commonly known. Such a panel may comprise:
   a trim element having a first outer face intended to be oriented towards the passenger compartment and a first inner face opposite to said first outer face,
      a support element having a second outer face oriented towards the first inner face of the trim element and a second inner face opposite to said second outer face,
      a group of force sensors configured for detecting a control force applied to the first outer face within a control area corresponding to each force sensor, each control area extending from the corresponding force sensor of the group of force sensors to the first outer face, each force sensor being carried by a printed circuit board fixed on the second inner face facing the control area.

It is understood that the group of force sensors comprises at least one force sensor. Each force sensor has a corresponding control area extending from the force sensor to the first outer face and of constant cross-section.

A force sensor is understood to mean a sensor capable of determining a force. An example of a force sensor consists of a strain gauge sensor in which a variation in elongation causes a variation in the electrical resistance of the strain gauge, the variation in the electrical resistance of the strain gauge therefore being a function of the deformation; and as the deformation of the strain gauge is a function of the applied force, the variation of the electrical resistance of the strain gauge is a function of the applied force. Typically, the signal from the force sensor is activated for a force detection value that is within ±20% of the nominal force value for a given function.

SUMMARY

An object of the invention is to improve the correspondence between the action of the user and the detection of this action, in other words to improve the reliability of the detection.

To remedy the above problem, according to an aspect of the invention the support element has a mechanical weakening within a detection area, said detection area including the group of control areas and extending around the group of control areas to a peripheral boundary located at a predetermined distance from the group of force sensors, said mechanical weakening being formed by a recess in the second inner face.

Due to the mechanical weakening, if a user presses on the first outer face outside of the detection area, the force applied by the user will be transmitted more weakly in the support element to each of the force sensors.

On the other hand, it is difficult to distinguish between the first outer face being pressed in the control area and the first outer face being pressed outside the control area but in the immediate vicinity of the control area. However, this distinction has appeared to be non-essential due to the fact that the user rarely presses in the immediate vicinity of a control area, except when wanting to press the control area or wanting to press an adjacent control area. However, the distinction between pressing a control area or an adjacent control area can be made satisfactorily, in particular by comparing the force detected in each control area.

Consequently, it appeared necessary to seek to distinguish only between a press on the first outer face with the intention to act on a device via the control panel and a press without any desire to act on a device. It was therefore decided to leave a "grey area" which may extend up to 3 centimeters around the control area, in order to better distinguish a press outside the detection area from a press within the control area.

According to an additional feature, the printed circuit board is preferably fixed on the second inner face by a structural glue, preferably an epoxy glue.

Epoxy glue creates high stiffness in the connection between the support element and the printed circuit board, unlike in particular an adhesive devoid of volatile solvent such as a double-sided adhesive. Thus, the force which is applied on the printed circuit board is very close to the force applied on the support element.

According to another feature, the recess in the second inner face is preferably configured so that the control force exerted on the first outer face within a control area of the group of control areas generates a detected control force detected by the corresponding force sensor, so that a parasitic force exerted on the first outer face outside the detection area generates a parasitic detected force detected by each of the force sensors, and so that the ratio between the parasitic detected force and the parasitic force is lower by more than 20%, preferably at least 30% lower, than the ratio between the control force and the detected control force.

Thus, due to this value which is "strictly 20% lower and preferably at least 30% lower", a parasitic force exerted on the first outer face outside the detection area will generate a force which will not be detectable by the force sensor and the distinction between a press outside the detection area and a press within the control area is made in an effective manner. Indeed, the signal from the force sensor is generally activated for a force detection value that is within ±20% of the nominal force value for a given function.

According to another feature, the group of force sensors preferably comprises at least two force sensors and the recess comprises a groove extending, at the peripheral boundary of the detection area, all the way around the group of force sensors.

There is thus a reduced chance that a press outside the detection area is considered as a press within one of the control areas, for the entire group of force sensors.

According to an alternative feature, the recess comprises a groove extending all the way around each sensor of the group of force sensors.

According to an additional feature, the groove preferably has a depth of between 0.3 millimeters and 1.5 millimeters.

According to another feature, the second inner face preferably has at least one countersink within which the printed circuit board of each force sensor is placed, the second inner face being flat at the countersink.

Thus, in the absence of a press on the first outer face, the force sensor presents a shape in which it has its best sensitivity and is capable of detecting the greatest amplitude of deformations.

According to another feature, the support element has a group of holes formed in the second inner face, each hole being circumscribed within a control area of the group of control areas and mechanically weakening the support element at each control area.

Thus, for a force applied to the given first given outer face, the deformation of the support in each control area is increased. Detection of a press in the control area is therefore improved.

According to an additional feature, each hole is preferably entirely covered by the printed circuit board.

Detection of a press within the area is thus improved in a more uniform manner.

According to another feature, the group of force sensors preferably comprises at least two force sensors.

According to another feature, the control panel preferably comprises a plurality of first retaining elements at a distance that is less than 3 centimeters from the detection area.

The control panel thus being kept close to the detection area, deformation of the control panel is reduced within the detection area, and in particular within the control areas, in the event of a press on the first outer face outside the detection area.

According to a complementary feature, the control panel preferably further comprises a plurality of second retaining elements at a distance that is greater than 5 centimeters from the detection area.

The control panel is thus firmly held outside the detection area.

The invention also relates to a control assembly comprising the control panel and a structure to which the control panel is fixed by the plurality of first retaining elements and the plurality of second retaining elements.

BRIEF DESCRIPTION OF THE DRAWINGS

Other features and advantages of the invention will become apparent from the following detailed description, referring to the appended drawings in which.

DETAILED DESCRIPTION

Figure 1:
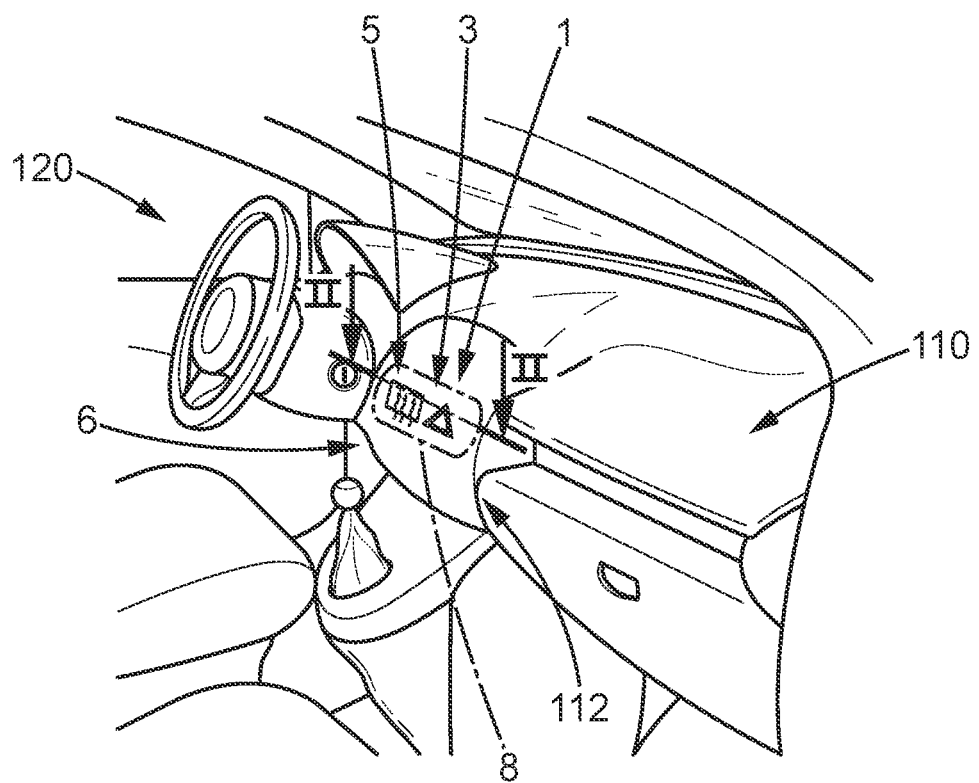
FIG. 1 illustrates a control assembly integrated into a center console of a dashboard.
Figure 2:
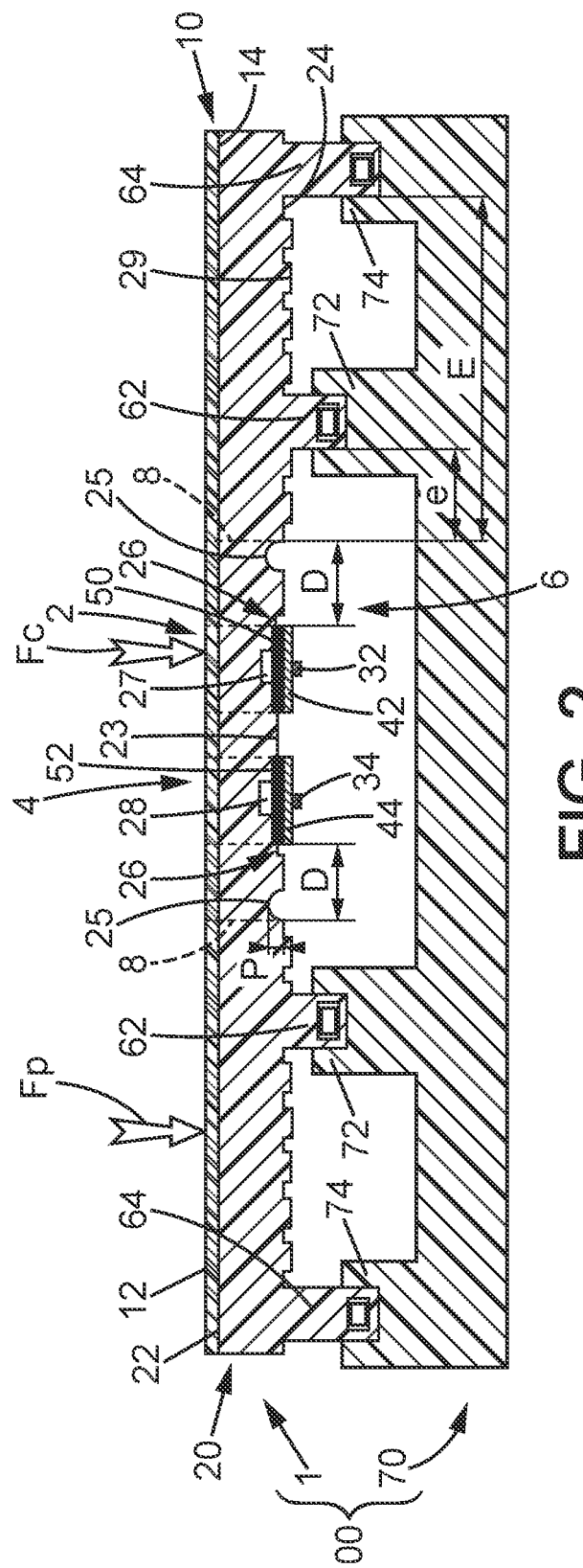
FIG. 2 illustrates a section view of the control assembly along line II-II indicated in FIG. 1.

FIGS. 1 and 2 illustrate a control assembly 100 arranged in a passenger compartment 120 of a vehicle and integrated into a dashboard 110, more specifically into a center console 112 of the dashboard 110.

The center console 112 incorporates a control assembly 100. The control assembly 100 comprises a structure 70 and a control panel 1. The control panel 1 comprises a support element 20, which is rigid and covered by a trim element 10.

The trim element 10 has a first outer face 12 and a first inner face 14. The first inner face 14 is opposite to the first outer face 12. The trim element 10 has a relatively constant thickness which is small compared to its length and width.

The support element 20 substantially forms a plate. The support element 20 has a second outer face 22 and a second inner face 24. The second inner face 24 is opposite to the second outer face 22. The second outer face 22 is facing the first inner face 14 to which the second outer face 22 is fixed.

In the illustrated embodiment, the second outer face 22 is fixed directly to the first inner face 14.

The control panel 1 further comprises a group of force sensors and a group of printed circuit boards associated with the group of force sensors. In the illustrated embodiment, the group of force sensors comprises a first force sensor 32 and a second force sensor 34, and the group of printed circuit boards comprises a first printed circuit board 42 and a second printed circuit board 44. The first force sensor 32 is carried by the first printed circuit board 42. The first printed circuit board 42 is arranged between the support element 20 and the first force sensor 32. The first printed circuit board 42 is fixed to the second inner surface 24 by a first layer of glue 50. The second force sensor 34 is carried by the second printed circuit board 44. The second printed circuit board 44 is arranged between the support element 20 and the second force sensor 34. The second printed circuit board 44 is fixed to the second inner surface 24 by a second layer of glue 52.

A first control area 2 extends from the first force sensor 32 to the first outer surface 12 and a second control area 4 extends from the second force sensor 34 to the first outer surface 12. The first control area 2 and the second control area 4 each have substantially the shape of a cylinder segment, symbolically delimited by a dotted line in FIG. 2. A first pictogram 3 is present on the first outer surface 12 at the first control area 2 and a second pictogram 5 is present on the first outer surface 12 at the second control area 4, in order to allow a user to identify the location of the first control area 2 and the location of the second control area 4, as well as the function actuated by pressing on the first control area 2 and on the second control area 4. The first pictogram 3 and second pictogram 5 are produced by printing on the first outer surface 12. Alternatively, the first pictogram 3 and second pictogram 5 may be produced by a backlit translucent portion integrated into the trim element 10, an insert of a different color integrated into the trim element, or by any other known means.

When a user applies a force to the first outer surface 12, the force applied to the first outer surface 12 causes deformation of the trim element 10 which is transmitted within the first control area 2 and within the second control area 4 to the first force sensor 32 and to the second force sensor 34.

The control panel 1 has a detection area 6 extending to a peripheral boundary 8. The detection area 6 includes the first control area 2 and the second control area 4.

When a user applies a control force Fc to the first outer surface 12 within the first control area 2 or second control area 4, the first force sensor 32 detects a first detected control force and the second force sensor 34 detects a second detected control force. To determine the presence of the control force Fc within the first control area 2 and/or within the second control area 4, the control assembly 100 comprises an electronic processor comparing the first detected control force and the second detected control force to a threshold. In addition, a comparison between the first detected control force and the second detected control force makes it possible to better determine the control area where the control force is applied among the first control area 2 and the second control area 4. Alternatively, inductive sensors could be used to detect whether the pressure is exerted within the first control area 2 or within the second control area 4.

When the first detected control force and the second detected control force lead the control assembly 100 to consider that a control force Fc is being applied to the first control area 2, the control unit 1 modifies the state of the corresponding device, in other words the control unit activates/deactivates the corresponding device, namely the hazard lights of the vehicle in the illustrated embodiment. When the first detected control force and the second detected control force lead the control assembly 100 to consider that a control force Fc is being applied to the second control area 2, the control assembly 1 modifies the state of the corresponding device, in other words the control unit activates/deactivates the corresponding device, namely the rear window defogger of the vehicle in the illustrated embodiment.

The control assembly is configured so that a parasitic force Fp exerted by a user on the first outer surface 12 outside the detection area 6 is not considered as a control force Fc applied within the first control area 2 or within the second control area 4.

More specifically, a parasitic force Fp applied to the first outer surface 12 outside the detection area 6 generates a first detected parasitic force and a second detected parasitic force. The first detected parasitic force is reduced by a value strictly 20% less and preferably at least 30% less than in the case where a force of the same intensity as the parasitic force Fp is applied within the first control area 2. Similarly, the second detected parasitic force is reduced by a value strictly 20% less and preferably at least 30% less than in the case where a force of the same intensity as the parasitic force Fp is applied within the second control area.

In other words, the control unit 100 is configured so that the ratio between the first detected parasitic force and the parasitic force Fp is strictly 20% less and preferably at least 30% less than the ratio between the first detected control force and the control force Fc, and so that the ratio between the second detected parasitic force and the parasitic force Fp is strictly 20% less and preferably at least 30% less than the ratio between the control force Fc and the second detected control force.

In the illustrated embodiment, outside the detection area, the support element 20 has ribs 29 projecting from the second inner surface 24. Preferably, the ribs 29 consist of two series of intersecting ribs, the ribs of each series being parallel to each other and perpendicular to the ribs of the other series. The control panel 20 is thus stiffened all around the detection area 6. Conversely, the second outer surface 24 has no ribs 29 within the detection area 6.

On the other hand, in the illustrated embodiment, the support element 20 has a groove 25 extending around the group of force sensors. The groove 25 extends inside the detection area 6 and defines the peripheral boundary 8 of the detection area 6. The groove 25 extends all the way around the group of force sensors, but not between the first force sensor 32 and the second force sensor 34. The peripheral boundary 8 extends at a distance D from the group of force sensors, the distance D being less than 3 centimeters, preferably between 2 and 2.5 centimeters. The peripheral boundary 8 of the detection area 6 has an oblong shape. Alternatively, the groove 25 could extend around the first force sensor 32 and around the second force sensor 34, thus extending between the first force sensor 32 and the second force sensor 34, forming a succession of contiguous or disjoint circles. The groove 25 has a depth P preferably between 0.3 millimeters and 1.5 millimeters. The width of the groove 25 is preferably between 1.5 millimeters and 2.5 millimeters.

The support element 20 further presents a group of first retaining elements 62 and a group of second retaining elements 64. The first retaining elements 62 are formed by first retaining tabs projecting from the second inner surface 24. The first retaining elements 62 are distributed around the detection area 6 and are at a distance e relative to the detection area 6 which is less than 3 centimeters, preferably close to 2.5 centimeters, in order to firmly hold the support element 20 around the detection area 6. The first retaining elements 62 are preferably 60 millimeters apart from each other at most.

The second retaining elements 64 are formed by second retaining tabs projecting from the second inner surface 24. The second retaining elements 62 are distributed around the periphery of the second inner surface 24 and are at a distance E relative to the detection area 6 which is greater than 5 centimeters.

The structure 70 is preferably composed of the chassis or is connected to the chassis. The structure 70 has first attachment studs 72 and second attachment studs 74. The first retaining elements 62 of the support element 20 are fixed to the first attachment studs 72 of the structure 70 and the second retaining elements 64 of the support element 20 are fixed to the second attachment studs 74 of the structure 70.

The group of first retaining elements preferably comprises between 3 and 10 first retaining elements 62. The group of second retaining elements preferably comprises between 3 and 10 second retaining elements 64.

Furthermore, the support element 20 has a countersink 26 created within the zone of the second inner surface 24, within the detection area 6. The countersink 26 comprises a support surface 23 constituting a portion of the second outer surface 24. The support surface 23 is flat and recessed, preferably by about 1 millimeter, relative to the rest of the second inner surface 24. The first printed circuit board 42 and the second printed circuit board 44 are fixed on the support surface 23.

Finally, in the illustrated embodiment, the support element 20 has a first hole 27 in the first control area 2 and a second hole 28 in the second control area 4. The first hole 27 and second hole 28 extend from the second inner face 24, more precisely in the support surface 23. The first hole 27 and second hole 28 have a bottom which is distanced from the second outer face 22. The first hole 27 is substantially centered relative to the first control area 42 and the second hole 28 is substantially centered relative to the second control area 42. The first hole 27 has a smaller section than the first printed circuit board 42 and the second hole 28 has a smaller section than the second printed circuit board 42, such that the first hole 27 is entirely covered by the first printed circuit board 42 which rests on the support surface 23 all around the first hole 27 and the second hole 28 is entirely covered by the second printed circuit board 44 which rests on the support surface 23 all around the second hole 28. In the illustrated embodiment, the first hole 27 and second hole 28 have a cylindrical shape of circular section.

The trim element 10 is preferably made of plastic, glass, wood, aluminum, carbon fiber, or the like. The support element 20 is preferably made of plastic molded onto the trim element 10. The plastic is preferably polycarbonate, polymethyl methacrylate, a mixture of polycarbonate and acrylonitrile butadiene styrene which may be reinforced with fiberglass or polyurethane. The printed circuit board is preferably made of fiberglass-reinforced epoxy resin composite or polyimide. The first layer of glue 50 and the second layer of glue 52 preferably consist of an adhesive based on epoxy resin, in order to impart very high stiffness to the connection between the support element 20 and the first and second printed circuit boards. The first force sensor 32 and the second force sensor 34 preferably consist of a microelectromechanical system, in particular of the NextInput® brand. Such a force sensor has a variable resistance as a function of its deformation, so that a pressure exerted on the first control area 2 or the second control area 4 generates a deformation of the second inner face 24 which is detected by the first force sensor 32 and the second force sensor 34.

Of course, the invention is in no way limited to the embodiment(s) described as non-limiting illustrations. Thus, the group of force sensors could comprise more than two force sensors and the group of printed circuit boards would consequently comprise more than two printed circuit boards. Conversely, the group of force sensors could consist of only one force sensor. Moreover, the dashboard console could comprise several control panels.

The invention claimed is:

1. Control panel for a passenger compartment of a vehicle, comprising:
    a trim element having a first outer face configured to be oriented towards the passenger compartment and a first inner face opposite to said first outer face,
    a support element having a second outer face oriented towards the first inner face of the trim element and a second inner face opposite to said second outer face, and
    a group of force sensors configured for detecting a control force applied to the first outer face within a control area corresponding to each force sensor, each control area extending from a corresponding force sensor of the group of force sensors to the first outer face, each force sensor of the group of force sensors being carried by a printed circuit board fixed on the second inner face facing the control area, each printed circuit board being arranged between the support element and the corresponding force sensor of the group of force sensors being carried by the printed circuit board,
    wherein the support element has a mechanical weakening within a detection area, said detection area including each of the control areas and extending around the control areas to a peripheral boundary located at a predetermined distance from the group of force sensors, said mechanical weakening being formed by a recess in the second inner face.

2. The control panel according to claim 1, wherein the recess in the second inner face is configured so that:
    the control force exerted on the first outer face within at least one of the control areas generates a detected control force detected by the corresponding force sensor,
    a parasitic force exerted on the first outer face outside the detection area generates a parasitic detected force detected by each of the force sensors, and
    the ratio between the parasitic detected force and the parasitic force is lower by more than 20% than the ratio between the detected control force and the control force.

3. The control panel according to claim 1, wherein the printed circuit board is fixed on the second inner face by a structural glue.

4. The control panel according to claim 3, wherein the structural glue is an epoxy glue.

5. The control panel according to claim 4, wherein the ratio between the parasitic detected force and the parasitic force is lower by more than 30% than the ratio between the detected control force and the control force.

6. The control panel according to claim 1, wherein the support element has a group of holes formed in the second inner face, each hole being located within one of the control areas and mechanically weakening the support element at that control area.

7. The control panel according to claim 6, wherein each hole is entirely covered by the printed circuit board.

8. The control panel according to claim 1, wherein the control panel comprises a plurality of first retaining elements at a distance that is less than 3 centimeters from the detection area.

9. The control panel according to claim 8, wherein the control panel further comprises a plurality of second retaining elements at a distance that is greater than 5 centimeters from the detection area.

10. A control assembly comprising the control panel according to claim 9 and a structure to which the control panel is fixed by the plurality of first retaining elements and the plurality of second retaining elements.

11. Control panel for a passenger compartment of a vehicle, comprising:
    a trim element having a first outer face configured to be oriented towards the passenger compartment and a first inner face opposite to said first outer face,
    a support element having a second outer face oriented towards the first inner face of the trim element and a second inner face opposite to said second outer face, and
    a group of force sensors configured for detecting a control force applied to the first outer face within a control area corresponding to each force sensor, each control area extending from a corresponding force sensor of the group of force sensors to the first outer face, each force sensor of the group of force sensors being carried by a printed circuit board fixed on the second inner face facing the control area,
    wherein the support element has a mechanical weakening within a detection area, said detection area including each of the control areas and extending around the control areas to a peripheral boundary located at a predetermined distance from the group of force sensors, said mechanical weakening being formed by a recess in the second inner face, wherein the group of force sensors comprises at least two force sensors and the recess comprises a groove extending, at the peripheral boundary of the detection area, all the way around the group of force sensors.

12. Control panel for a passenger compartment of a vehicle, comprising:
    a trim element having a first outer face configured to be oriented towards the passenger compartment and a first inner face opposite to said first outer face,
    a support element having a second outer face oriented towards the first inner face of the trim element and a second inner face opposite to said second outer face, and
    a group of force sensors configured for detecting a control force applied to the first outer face within a control area corresponding to each force sensor, each control area extending from a corresponding force sensor of the group of force sensors to the first outer face, each force sensor of the group of force sensors being carried by a printed circuit board fixed on the second inner face facing the control area,
    wherein the support element has a mechanical weakening within a detection area, said detection area including each of the control areas and extending around the control areas to a peripheral boundary located at a predetermined distance from the group of force sensors, said mechanical weakening being formed by a recess in the second inner face, wherein the second inner face has at least one countersink within which the printed circuit board of each force sensor is arranged, the second inner face being flat at the countersink.

* * * * *